US009998091B2

United States Patent
Kikuchi et al.

(10) Patent No.: US 9,998,091 B2
(45) Date of Patent: Jun. 12, 2018

(54) ELASTIC WAVE DEVICE AND FABRICATION METHOD THEREOF

(71) Applicant: Murata Manufacturing Co., Ltd., Nagaokakyo-shi, Kyoto-fu (JP)

(72) Inventors: Taku Kikuchi, Nagaokakyo (JP); Daisuke Fukuda, Nagaokakyo (JP); Yasumasa Taniguchi, Nagaokakyo (JP); Masakazu Mimura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 126 days.

(21) Appl. No.: 15/176,529

(22) Filed: Jun. 8, 2016

(65) Prior Publication Data

US 2016/0285430 A1 Sep. 29, 2016

Related U.S. Application Data

(63) Continuation of application No. PCT/JP2014/083555, filed on Dec. 18, 2014.

(30) Foreign Application Priority Data

Dec. 26, 2013 (JP) ................................. 2013-269429

(51) Int. Cl.
*H03H 9/25* (2006.01)
*H03H 9/64* (2006.01)
(Continued)

(52) U.S. Cl.
CPC .......... *H03H 9/02921* (2013.01); *H03H 3/08* (2013.01); *H03H 9/02992* (2013.01);
(Continued)

(58) Field of Classification Search
CPC ........... H03H 9/02818; H03H 9/02921; H03H 9/1092; H03H 9/14541; H03H 9/25;
(Continued)

(56) References Cited

U.S. PATENT DOCUMENTS 5,889,446 A * 3/1999 Yamada ............. H03H 9/02921
310/313 B
6,417,026 B2 * 7/2002 Gotoh ................. H01L 23/3135
257/E23.126
(Continued)

FOREIGN PATENT DOCUMENTS

JP 3-16409 A 1/1991
JP 2005-244670 * 9/2005
(Continued)

OTHER PUBLICATIONS

English language machine translation of JP 2005-244670, published Sep. 8, 2005, 9 pages provided.*
(Continued)

Primary Examiner — Barbara Summons
(74) Attorney, Agent, or Firm — Keating & Bennett, LLP

(57) ABSTRACT

An elastic wave device includes a dielectric film on a piezoelectric substrate, an IDT electrode including first and second comb electrodes on the dielectric film, first and second wiring electrodes electrically connected to the first and second comb electrodes, wherein the first comb electrode and the second comb electrode each include electrode fingers and a busbar in contact with the electrode fingers. An electrical conductivity of the piezoelectric substrate is higher than the electrical conductivity of the dielectric film. At least one of the first wiring electrode, the second wiring electrode, the busbar of the first comb electrode, and the busbar of the second comb electrode includes a portion that is in direct contact with the piezoelectric substrate.

17 Claims, 5 Drawing Sheets

(51) Int. Cl.
- *H03H 9/145* (2006.01)
- *H03H 3/08* (2006.01)
- *H03H 9/10* (2006.01)
- *H03H 9/02* (2006.01)
- *H03H 3/02* (2006.01)
- *H03H 9/17* (2006.01)
- *H03H 9/205* (2006.01)
- *H03H 9/54* (2006.01)

(52) U.S. Cl.
CPC ...... *H03H 9/1092* (2013.01); *H03H 9/14541* (2013.01); *H03H 9/25* (2013.01); *H03H 9/64* (2013.01); *H03H 3/02* (2013.01); *H03H 9/1071* (2013.01); *H03H 9/172* (2013.01); *H03H 9/176* (2013.01); *H03H 9/205* (2013.01); *H03H 9/54* (2013.01)

(58) Field of Classification Search
CPC .. H03H 9/64; H03H 9/02834; H03H 9/02937; H03H 9/02952; H03H 9/6489; H03H 3/02; H03H 3/08; H03H 9/1071; H03H 9/172; H03H 9/176; H03H 9/205; H03H 9/54; H03H 9/02992
USPC .............. 333/193–195; 310/313 B; 29/25.35
See application file for complete search history.

(56) References Cited

U.S. PATENT DOCUMENTS

| | | | | |
|---|---|---|---|---|
| 7,854,050 | B2* | 12/2010 | Aikawa | H03H 3/08 29/25.35 |
| 8,097,178 | B2* | 1/2012 | Obara | H03H 3/08 216/58 |
| 8,222,972 | B2* | 7/2012 | Inoue | H03H 9/0222 333/133 |
| 8,461,940 | B2* | 6/2013 | Takada | H03H 9/0523 333/186 |
| 2006/0131991 | A1* | 6/2006 | Kawakami | H03H 9/02984 310/311 |
| 2007/0204788 | A1* | 9/2007 | Kajigaya | C30B 15/00 117/13 |
| 2012/0200371 | A1 | 8/2012 | Yamashita | |
| 2013/0051588 | A1* | 2/2013 | Ruile | H03H 3/08 381/190 |
| 2013/0234558 | A1 | 9/2013 | Tsuda | |
| 2015/0084128 | A1* | 3/2015 | Gambino | H01L 23/34 257/347 |

FOREIGN PATENT DOCUMENTS

| | | | |
|---|---|---|---|
| JP | 2005-260909 | * | 9/2005 |
| JP | 2010-50726 A | | 3/2010 |
| JP | 2010-68484 A | | 3/2010 |
| JP | 2012-169707 A | | 9/2012 |
| JP | 2013-201468 A | | 10/2013 |
| WO | 2012/063521 A1 | | 5/2012 |

OTHER PUBLICATIONS

English language machine translation of JP 03-016409, published Jan. 24, 1991, 5 pages provided.*

English language machine translation of JP 2005-260909, published Sep. 22, 2005, 10 pages provided.*

Official Communication issued in International Application PCT/JP2014/083555, dated Feb. 24, 2015.

* cited by examiner

ELASTIC WAVE DEVICE AND FABRICATION METHOD THEREOF

CROSS REFERENCE TO RELATED APPLICATIONS

This application claims the benefit of priority to Japanese Patent Application 2013-269429 filed Dec. 26, 2013 and is a Continuation Application of PCT/JP2014/083555 filed on Dec. 18, 2014. The entire content of each application are hereby incorporated by reference.

BACKGROUND OF THE INVENTION

1. Field of the Invention

The present invention relates to elastic wave devices in which a dielectric film is provided between a piezoelectric substrate and an interdigital transducer (IDT) electrode, and to fabrication methods thereof.

2. Description of the Related Art

In the prior art, elastic wave devices are widely used as resonators and bandpass filters. Japanese Unexamined Patent Application Publication No. 2012-169707 discloses an example of such elastic wave devices. In Japanese Unexamined Patent Application Publication No. 2012-169707, a dielectric layer is formed on a piezoelectric substrate. On the dielectric layer, a first IDT electrode and a second IDT electrode are provided. The thickness of a dielectric layer disposed between the first IDT electrode and the piezoelectric substrate differs from the thickness of a dielectric layer disposed between the second IDT electrode and the piezoelectric substrate. The electromechanical coupling coefficient is varied by changing the thickness of the dielectric layer. This makes the band width ratio of the first IDT electrode different from the band width ratio of the second IDT electrode.

In the elastic wave devices having dielectric films such as one described in Japanese Unexamined Patent Application Publication No. 2012-169707, electrostatic breakdown may sometimes occur when static electricity is accumulated. For example, static electricity may sometimes accumulate due to frictional electrification during a cleaning process after resin sealing. Typically, the IDT electrode consists of two comb electrodes that are interdigitated with each other. Thus, when static electricity is accumulated at the IDT electrode, a large potential difference is generated between one of the comb electrodes and the other comb electrode. As a result, in some cases, the IDT electrode is damaged by the electrostatic breakdown.

SUMMARY OF THE INVENTION

Preferred embodiments of the present invention provide elastic wave devices that are less likely to suffer electrostatic breakdown due to static electricity and provide methods of manufacturing such an elastic wave device.

An elastic wave device according to a preferred embodiment of the present invention includes a piezoelectric substrate; a dielectric film located on the piezoelectric substrate; an IDT electrode located on the dielectric film and including a first comb electrode and a second comb electrode; and a first wiring electrode and a second wiring electrode electrically connected to the first comb electrode and the second comb electrode, respectively, wherein the first comb electrode and the second comb electrode each include electrode fingers and a busbar, the busbar being in contact with the electrode fingers; an electrical conductivity of the piezoelectric substrate is higher than an electrical conductivity of the dielectric film; at least one of the first wiring electrode, the second wiring electrode, the busbar of the first comb electrode, and the busbar of the second comb electrode includes a portion that is in direct contact with the piezoelectric substrate.

In a specific aspect of an elastic wave device according to a preferred embodiment of the present invention, at least one of the first wiring electrode and the second wiring electrode protrudes out of a region of the dielectric film and is in contact with the piezoelectric substrate at a protruded location.

In another specific aspect of an elastic wave device according to a preferred embodiment of the present invention, at least one of the first wiring electrode and the second wiring electrode includes a lower electrode layer and an upper electrode layer stacked on the lower electrode layer, and the upper electrode layer is in contact with the piezoelectric substrate.

In still another specific aspect of an elastic wave device according to a preferred embodiment of the present invention, the first wiring electrode and the second wiring electrode each include a portion that is in direct contact with the piezoelectric substrate.

In still another specific aspect of an elastic wave device according to a preferred embodiment of the present invention, at least one of the busbar of the first comb electrode and the busbar of the second comb electrode includes a portion that is in direct contact with the piezoelectric substrate.

In still another specific aspect of an elastic wave device according to a preferred embodiment of the present invention, the piezoelectric substrate is a piezoelectric substrate made of a material that has been reduction-treated.

In still another specific aspect of an elastic wave device according to a preferred embodiment of the present invention, the elastic wave device further includes a frame-shape support member stacked on the piezoelectric substrate and surrounding a portion where the IDT electrode is located; and a cover member that closes an opening of the support member, to define a wafer level package structure.

An elastic wave device fabricating method according to a preferred embodiment of the present invention is a method for fabricating an elastic wave device according to a preferred embodiment of the present invention and includes a step of forming the dielectric film on the piezoelectric substrate, the dielectric film having a lower electrical conductivity than the piezoelectric substrate; a step of forming the first comb electrode and the second comb electrode to form the IDT electrode on the dielectric film; and a step of forming at least one of the first wiring electrode, the second wiring electrode, the busbar of the first comb electrode, and the busbar of the second comb electrode to include a portion that is in contact with the piezoelectric substrate, and the first wiring electrode and the second wiring electrode is electrically connected to the first comb electrode and the second comb electrode.

In a specific aspect of an elastic wave device fabricating method according to a preferred embodiment of the present invention, the first wiring electrode and the second wiring electrode are each formed so as to include a portion that is in direct contact with the piezoelectric substrate.

In another specific aspect of an elastic wave device fabricating method according to a preferred embodiment of the present invention, a first busbar and a second busbar are formed such that at least one of the busbar of the first comb electrode and the busbar of the second comb electrode includes a portion that is in direct contact with the piezoelectric substrate.

In still another specific aspect of an elastic wave device fabricating method according to a preferred embodiment of the present invention, the dielectric film located outside the region where the IDT electrode is formed is removed by etching during the step of forming the dielectric film on the piezoelectric substrate.

In an elastic wave device and a fabrication method thereof according to various preferred embodiments of the present invention, the electrostatic breakdown between the first and second comb electrodes of the IDT electrode is less likely to occur even when static electricity is accumulated. Thus, failure is less likely to occur in an elastic wave device even when static electricity is accumulated during a cleaning process or a process in which heat is applied at the time of fabricating.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is disclosed in detail by describing specific preferred embodiments of the present invention with reference to the drawings.

Figure 3:
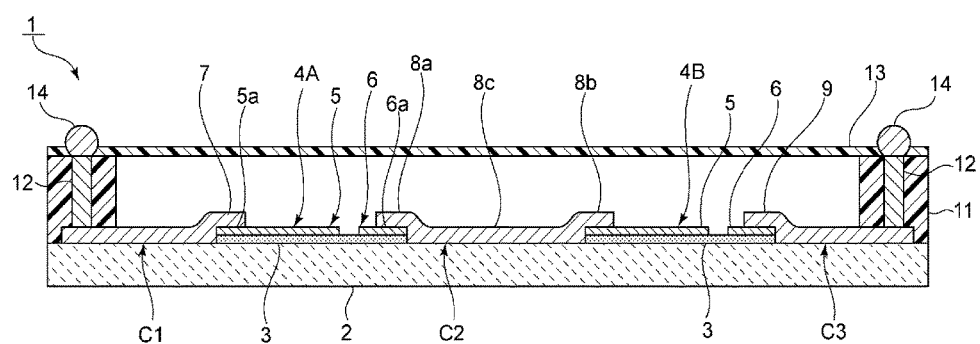
FIG. 3 is a front cross sectional view of an elastic wave device according to a preferred embodiment of the present invention.

FIG. 3 is a front cross sectional view of an elastic wave device according to a preferred embodiment of the present invention. An elastic wave device 1 includes a piezoelectric substrate 2. As the piezoelectric substrate 2, a substrate made of a piezoelectric single crystal such as LiTaO$_3$, LiNbO$_3$, and the like may be used. Alternatively, a substrate made of piezoelectric ceramics may also be used as the piezoelectric substrate 2.

Preferably, as the piezoelectric substrate 2, a piezoelectric substrate made of a reduction-treated material is used. In a case that the piezoelectric substrate 2 has undergone reduction treatment, the treated piezoelectric substrate 2 has a higher electrical conductivity than a piezoelectric substrate that has not undergone reduction treatment. Thus, static electricity is more effectively discharged to the piezoelectric substrate 2 side.

On the piezoelectric substrate 2, dielectric films 3 and 3 are provided. In the present preferred embodiment, the dielectric film 3 is preferably formed of silicon oxide. The dielectric material that forms the dielectric film 3 is not limited to silicon oxide. Any suitable dielectric material such as silicon nitride, silicon oxynitride, aluminum nitride, tantalum oxide, titanium oxide, alumina, or the like may be used. The dielectric film 3 is provided in the elastic wave device 1 for adjustment of electromechanical coupling coefficient of an elastic wave to be used.

The electrical conductivity of silicon oxide is between $1.0 \times 10^{-17}$ S/m and $1.0 \times 10^{-16}$ S/m inclusive, the electrical conductivity of LiNbO$_3$ is between $1.0 \times 10^{-10}$ S/m and $1.0 \times 10^{-9}$ S/m inclusive, and the electrical conductivity of LiTaO$_3$ is between $1.0 \times 10^{-12}$ S/m and $1.0 \times 10^{-10}$ S/m inclusive. In other words, the electrical conductivity of the piezoelectric substrate 2 is made larger than the electrical conductivity of the dielectric film 3 formed of silicon oxide.

On the dielectric film 3, IDT electrodes 4A and 4B are provided. The IDT electrodes 4A and 4B each include a first comb electrode 5 and a second comb electrode 6. The comb electrodes 5 and 6 include busbar portions 5a and 6a and pluralities of electrode fingers.

Figure 1:
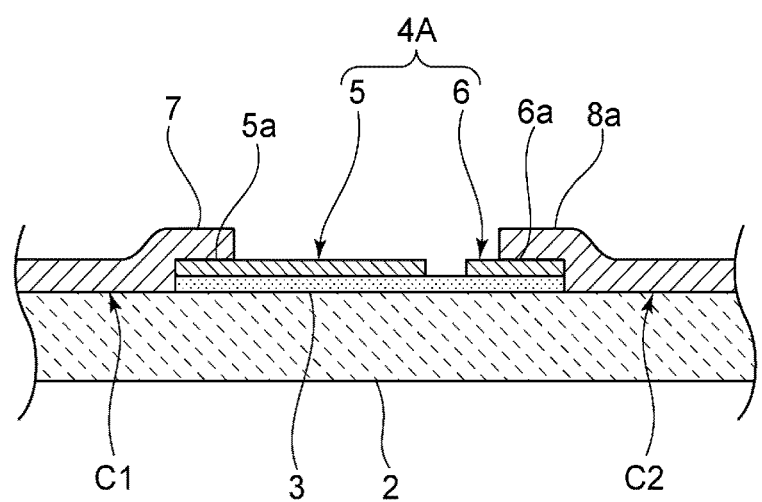
FIG. 1 is a partial cutaway cross sectional view depicting a main portion of an elastic wave device according to a preferred embodiment of the present invention, and is a cross sectional view of a portion along line A-A in FIG. 2.
Figure 2:
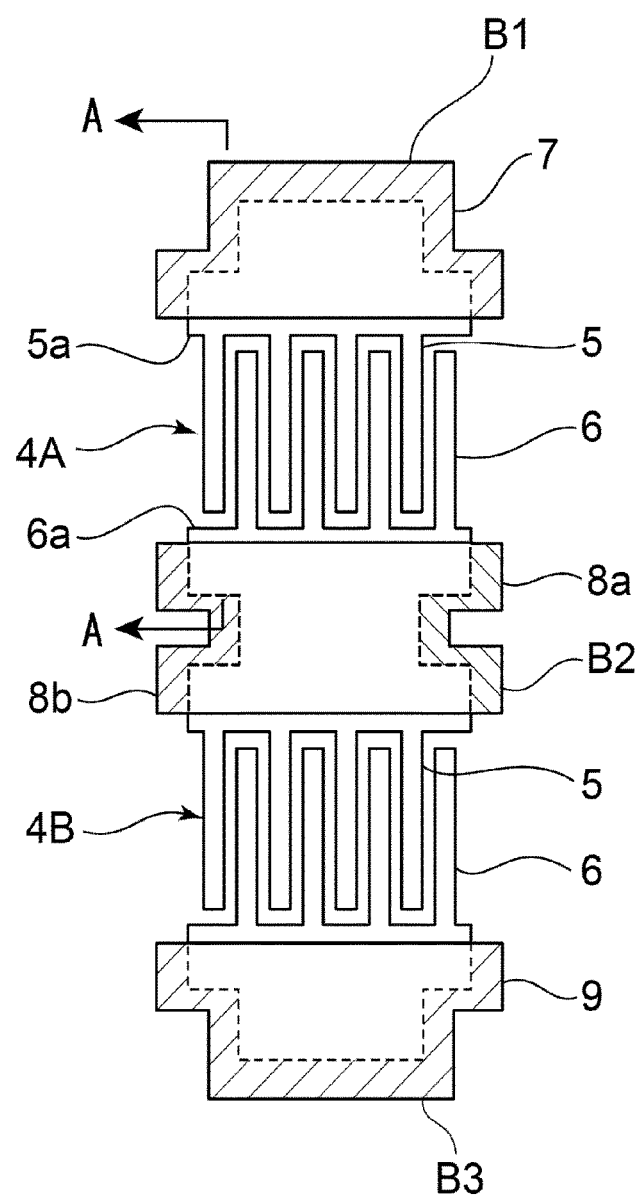
FIG. 2 is a schematic plan view illustrating an electrode structure of an elastic wave device according to a preferred embodiment of the present invention.

FIG. 2 is a schematic plan view depicting an electrode structure on the piezoelectric substrate 2. FIG. 1 is a cross sectional view at line A-A of FIG. 2.

As depicted in FIG. 2, in the present preferred embodiment, two IDT electrodes 4A and 4B are connected in series. The comb electrodes 5 and 6 each include a plurality of electrode fingers. The electrode fingers of the comb electrode 5 and the electrode fingers of the comb electrode 6 are interdigitated with each other.

In the electrode structure of FIG. 2, the dielectric film 3 is not provided at regions B1 to B3 at which diagonal hatching is drawn. Furthermore, the dielectric film 3 is not provided at a region below a support member 11, which will be described below with reference to FIG. 3.

Thus, in the IDT electrodes 4A and 4B, the dielectric film 3 is provided below a region where the electrode fingers of the comb electrode 5 and the electrode fingers of the comb electrode 6 are interdigitated with each other. Provision of the dielectric film 3 enables, by adjusting the thickness or composition of the dielectric film 3, the adjustment of electromechanical coupling coefficient of an elastic wave excited by the IDT electrodes 4A and 4B.

The first comb electrode 5 of the IDT electrode 4A is electrically connected to a first wiring electrode 7. The first wiring electrode 7 covers a portion of the busbar portion 5a of the first comb electrode 5 and is in direct contact with the piezoelectric substrate 2 at an area outside the first comb electrode 5 as denoted by an arrow C1.

A second wiring electrode 8a is electrically connected to the second comb electrode 6. The second wiring electrode 8a covers a portion of a top surface of the busbar portion 6a of the second comb electrode 6. Furthermore, at an area outside the busbar portion 6a, the second wiring electrode 8a is in direct contact with a top surface of the piezoelectric substrate 2 as denoted by an arrow C2.

Similarly, on the second IDT electrode 4B side, a first wiring electrode 8b is connected to the first comb electrode 5. A second wiring electrode 9 is electrically connected to the second comb electrode 6. In the present preferred embodiment, the second wiring electrode 8a on the first IDT electrode 4A side and the first wiring electrode 8b on the IDT electrode 4B side are joined together with a joining portion 8c. This connects the IDT electrode 4A and the IDT electrode 4B in series.

A second wiring electrode 9 covers a portion of a top surface of the busbar portion 6a of the second comb electrode 6. Furthermore, the second wiring electrode 9 is also in direct contact with the top surface of the piezoelectric substrate 2 as denoted by an arrow C3.

The first and second comb electrodes 5 and 6 that define and function as a first layer electrode film may be made of an appropriate metal or alloy such as Al, Cu, Pt, Au, W, Ta, Mo, AlCu, NiCr, Ti, and the like. Alternatively, the comb electrodes 5 and 6 may be made of a laminated metal film that includes a stack of a plurality of metal films.

The appropriate metal or alloy described above may also be used to define the first wiring electrodes 7 and 8b and the second wiring electrodes 8a and 9. The first wiring electrodes 7 and 8b and the second wiring electrodes 8a and 9 may be made of the same metal material as that of the comb electrodes 5 and 6 or may be made of a different metal material. Alternatively, a laminated metal film including a stack of a plurality of metal films may be used. In other words, at least one of the first wiring electrodes 7 and 8b and the second wiring electrodes 8a and 9 may include, for example, a lower electrode layer and a upper electrode layer that is stacked on the lower electrode layer, and may be structured in such a way that the upper electrode layer is in contact with the piezoelectric substrate.

In the present preferred embodiment, the first wiring electrodes 7 and 8b and the second wiring electrodes 8a and 9 are in direct contact with the top surface of the piezoelectric substrate 2 at the areas denoted by the arrows C1 to C3.

On the other hand, the electrical conductivity of the piezoelectric substrate 2 is higher than the electrical conductivity of the dielectric film 3. Accordingly, static electricity is allowed to escape to the piezoelectric substrate side when the static electricity is accumulated, as will be described later. This ensures the reduction or prevention of electrostatic breakdown at the comb electrodes 5 and 6.

Returning to FIG. 3, the support member 11 with a frame shape is provided on the piezoelectric substrate 2. The support member 11 may be made of synthetic resin or ceramics. The support member 11 preferably has a rectangular or substantially rectangular shape. The support member 11 is provided with through holes that penetrate in an up-and-down direction. In this through hole, an under bump metal layer 12 is provided.

The under bump metal layer 12 may also be made of an appropriate metal or alloy.

A cover member 13 is fixed on a top surface of the support member 11 so as to close the upper portion of the opening of the support member 11. This seals a space in which the IDT electrodes 4A and 4B are provided. The cover member 13 may be made of synthetic resin or an appropriate insulating material such as insulating ceramics and the like. Through holes are also provided in the cover member 13. The through holes of the cover member 13 are provided at regions where the under bump metal layer 12 is located. Metal bumps 14 are joined on the under bump metal layer 12. The metal bump 14 may be made of Au, solder, and the like.

The elastic wave device 1 is able to be surface-mounted on a circuit board or the like from the side where the metal bumps 14 and 14 are provided.

In some cases, the elastic wave device 1 is subjected to high pressure cleaning after assembly. In such a cleaning process, static electricity may sometimes accumulate because of frictional electrification between high pressure cleaning water and the support member 11 or the cover member 13. In particular, in a case that the support member 11 or the cover member 13 is made of synthetic resin, static electricity is likely to accumulate on the support member 11 or the cover member 13.

In prior art elastic wave devices, electrostatic breakdown may sometimes occur when static electricity is accumulated and a potential difference is produced between one of the comb electrodes of the IDT electrode and the other comb electrode.

In contrast, according to the present preferred embodiment, the first wiring electrode 7 and second wiring electrode 8a are each in direct contact with the piezoelectric substrate 2. Furthermore, the first wiring electrode 8b and the second wiring electrode 9 each also include a portion that is in direct contact with the piezoelectric substrate 2. On the other hand, the electrical conductivity of the piezoelectric substrate is higher than the electrical conductivity of the dielectric film 3. Thus, in the elastic wave device 1, static electricity flows out to the piezoelectric substrate 2 side, not to the dielectric film 3. As a result, electrostatic breakdown is less likely to occur between the first comb electrode 5 and the second comb electrode 6 that are connected to different electric potentials. Although the present preferred embodiment describes the configuration in which the first wiring electrode 7 and the second wiring electrode 8a each preferably include a portion that is in direct contact with the piezoelectric substrate 2, the configuration is not limited thereto. For example, the second wiring electrode may not necessarily be in direct contact with the piezoelectric substrate 2 as long as the first wiring electrode 7 is in direct contact with the piezoelectric substrate 2. As stated above, however, the structure in which both the first wiring electrode 7 and the second wiring electrode 8a are in direct contact with the piezoelectric substrate 2 is preferable.

Next, a non-limiting example of a method of manufacturing the elastic wave device 1 is described. When fabricating the elastic wave device 1, first, the piezoelectric substrate 2 is prepared. Next, the dielectric film 3 is formed on the piezoelectric substrate 2. The method for forming the dielectric film 3 is not limited to a particular method, and a thin-film forming method such as sputtering, vapor deposition, ALD, and the like may be used.

When forming the dielectric film 3, a single dielectric film may be formed, or a plurality of dielectric films may be stacked. In other words, the dielectric film 3 may be a multilayer dielectric film.

Next, the IDT electrodes 4A and 4B are formed. The IDT electrodes 4A and 4B may be formed by use of an appropriate thin-film microfabrication technology such as a liftoff process and the like.

Next, the dielectric film 3 is removed from at least a portion of the region where the IDT electrodes 4A and 4B are not formed by etching such as a dry etching process and the like. In the present preferred embodiment, the dielectric film 3 is removed from the area including a region surrounded by arrows B1 to B3 denoted in FIG. 2 and a region below the support member 11. In this case, only the dielectric film on which the IDT electrodes 4A and 4B are not disposed can be selectively removed with ease by using the IDT electrodes 4A and 4B as masks.

Next, as a second layer metal film, the first wiring electrode 7, the second wiring electrode 8a, the first wiring electrode 8b, the second wiring electrode 9, and a joining portion 8c are formed. The forming method is not limited to a particular method, and an appropriate thin-film forming method such as vapor deposition, sputtering, and the like may be used.

When forming the first wiring electrodes 7 and 8b and the second wiring electrodes 8a and 9, patterning may be performed by use of an appropriate microfabrication technology such as a liftoff process and the like. In this case, there is portion where the top surface of the piezoelectric substrate 2 is exposed after removing the dielectric film 3 disposed on the piezoelectric substrate 2 by etching as described above. Accordingly, as denoted by the arrows C1 to C3 in FIG. 3, the first wiring electrodes 7 and 8b and second wiring electrodes 8a and 9 are formed to be securely in direct contact with the top surface of the piezoelectric substrate 2 with ease.

In the foregoing preferred embodiment, a resonator including the IDT electrode 4A and a resonator including the IDT electrode 4B are each in direct contact with the top surface of the piezoelectric substrate 2 at the first and second wiring electrodes 7, 8b, 8a, and 9 that are connected to the comb electrodes 5 and 6 connecting to different electrical potentials. In the present invention, the first and second wiring electrodes are not necessarily in direct contact with the piezoelectric substrate 2 in all of resonator constituting portions. In other words, the first and second wiring electrodes may be in direct contact with the piezoelectric substrate 2 only in the resonator constituting portion that likely to suffer electrostatic breakdown. Preferably, as in the present preferred embodiment, it is desirable that the first and second wiring electrodes 7, 8b, 8a, and 9 are in direct contact with the piezoelectric substrate 2 in all the IDT electrodes 4A and 4B.

Although the foregoing non-limiting example of a method of manufacturing is described as a fabrication process for a single elastic wave device 1, in practice, individual elastic wave devices 1 are able to be obtained by fabricating a mother structure and cutting the fabricated mother structure with a dicing machine afterward. During the cutting, electrostatic breakdown may sometimes occur because of static buildup due to stripping in a dicing tape attachment process and a stripping process and generation of pyroelectric charges due to heating. Even in that case, various preferred embodiments of the present invention ensure reduction or prevention of electrostatic breakdown.

Figure 4:
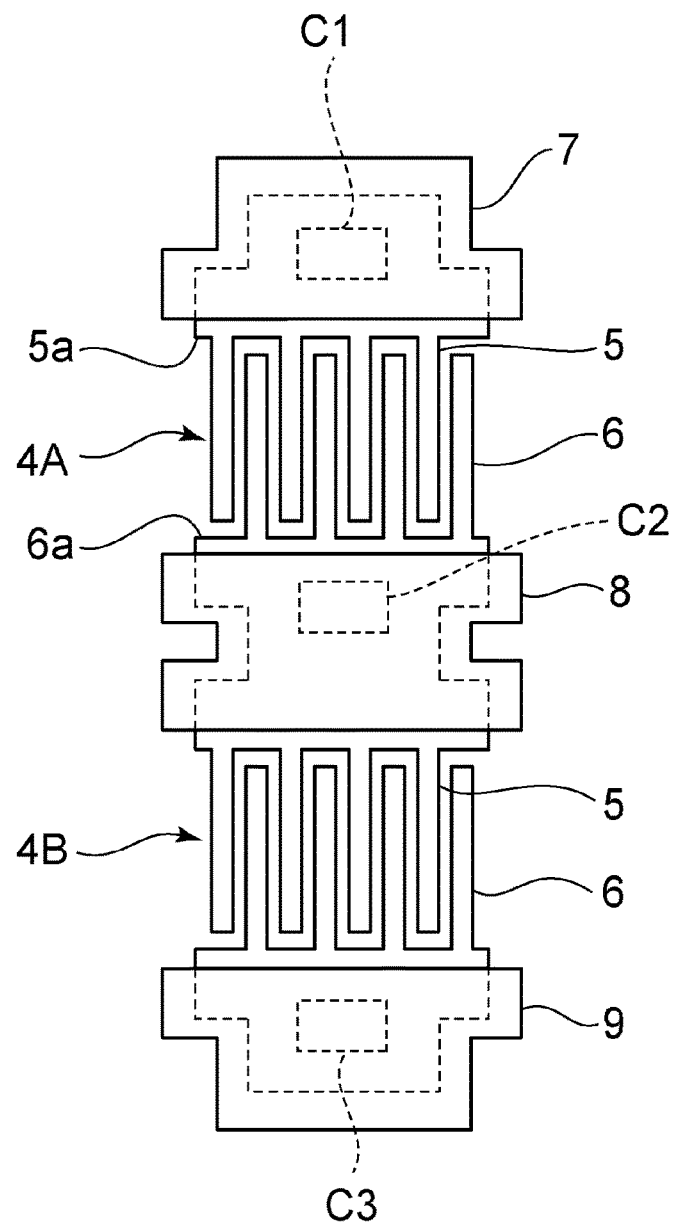
FIG. 4 is a schematic plan view illustrating an electrode structure of an elastic wave device according to another preferred embodiment of the present invention.

FIG. 4 is a schematic plan view for describing an electrode structure of an elastic wave device according to another preferred embodiment of the present invention. In the present preferred embodiment, the wiring electrodes 7 to 9 are in direct contact with the piezoelectric substrate at regions C1 to C3. In other words, the busbar portions of the IDT electrodes 4A and 4B are not provided at the regions C1 to C3 that are surrounded by dashed lines. The regions C1 to C3 are electrode missing portions in the IDT electrodes. In the missing portions, no dielectric film is provided, either. Accordingly, in the regions C1 to C3, the wiring electrodes 7 to 9 are in direct contact with the piezoelectric substrate.

In the preferred embodiments depicted in FIG. 2 and FIG. 4, the first and second wiring electrodes are in contact with the piezoelectric substrate. Alternatively, instead of the first and second wiring electrodes, the busbar portions, which are portions of the IDT electrodes 4A and 4B from which the electrode fingers are excluded, may be in direct contact with the piezoelectric substrate. For example, the busbar portion may be configured to the contrary so as not to have the electrode missing portion by removing the dielectric film at the regions C1 to C3 in FIG. 4. In that case, in the regions C1 to C3, the busbar portion is in direct contact with the piezoelectric substrate because the dielectric film is absent at the regions C1 to C3.

Accordingly, in various preferred embodiments of the present invention, at least one of the first wiring electrode, the second wiring electrode, the busbar of the first comb electrode, and the busbar of the second comb electrode preferably includes a portion that is in contact with the piezoelectric substrate.

Preferably, as in the previously-described preferred embodiment, it is desirable that both the first wiring electrode and the second wiring electrode are in contact with the piezoelectric substrate. Similarly, it is preferable that both the busbar of the first comb electrode and the busbar of the second comb electrode are in contact with the piezoelectric substrate. This further ensures the reduction or prevention of electrostatic breakdown.

Next, advantageous effects of the foregoing preferred embodiment are described on the basis of a specific experimental example.

Figure 5:
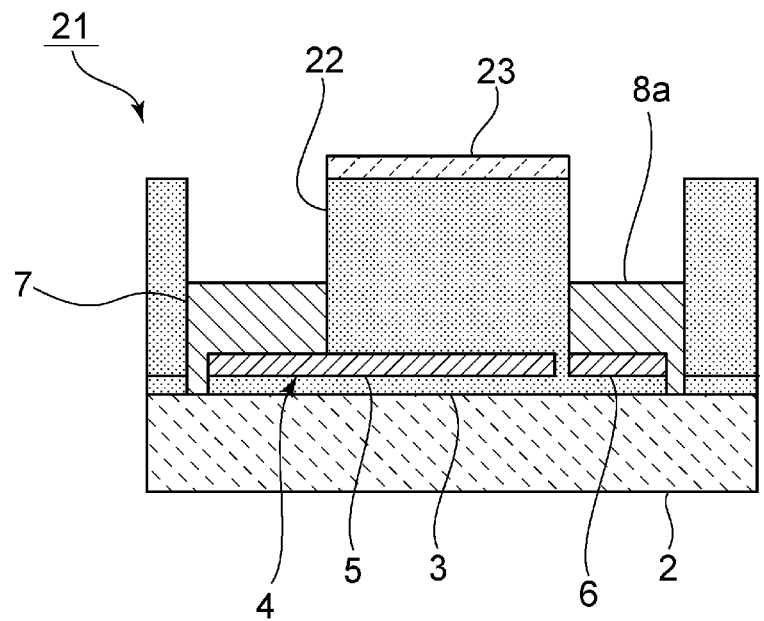
FIG. 5 is a schematic front cross sectional view illustrating effects of an exemplary elastic wave device.

FIG. 5 is a front cross sectional view that schematically depicts a structure of an elastic wave device prepared as a non-limiting working example. In this elastic wave device 21, the piezoelectric substrate 2 is formed of $LiNbO_3$. On this piezoelectric substrate 2, a $SiO_2$ film having a thickness of 10 nm is formed as the dielectric film 3. Subsequently, on this dielectric film 3, a metal film that consists of NiCr, Pt, Ti, and AlCu and has a thickness of 280 nm is formed as the IDT electrode 4 including the first and second comb electrodes 5 and 6. Next, a metal film that consists of Ti and AlCu and has a thickness of 3100 nm is formed as the first and second wiring electrodes 7 and 8a. Furthermore, a $SiO_2$ layer 22 having a thickness of 730 nm and a SiN layer 23 having a thickness of 20 nm are formed. The $SiO_2$ layer 22 is formed to improve temperature characteristics. Whereas, the SiN layer 23 is formed as a protective film.

Figure 6:
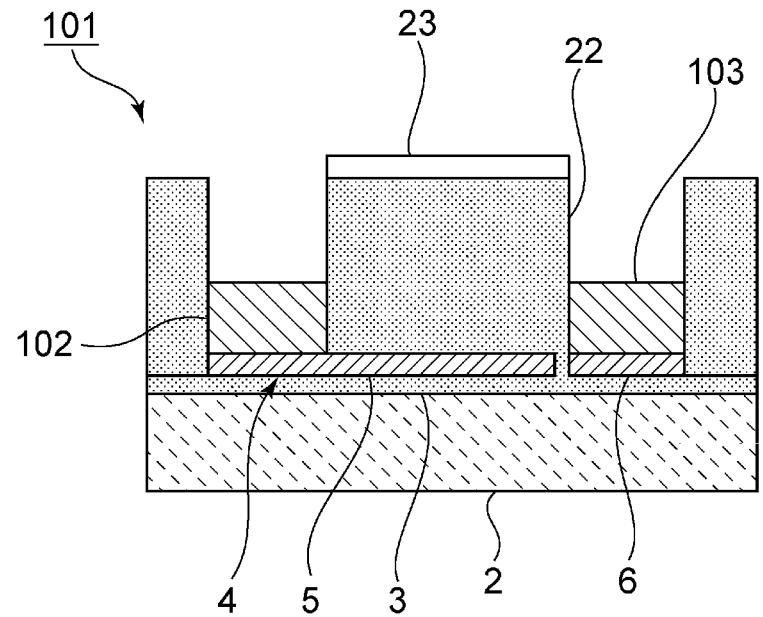
FIG. 6 is a schematic front cross sectional view illustrating an electrode structure of an elastic wave device of a comparative example.

For comparison, an elastic wave device 101 depicted in FIG. 6 is prepared. This elastic wave device 101 is similar to the elastic wave device 21 except that a first wiring electrode 102 and a second wiring electrode 103 are not in contact with the piezoelectric substrate 2 and are placed above the dielectric film 3.

As a result, whereas the breakdown ratio of comb electrode portion at the time of high pressure jet cleaning was 13% in the comparison example, the breakdown ratio in the elastic wave device 21 of the foregoing example was 10.7% when the length of the wiring electrode in direct contact with the piezoelectric substrate was 4 μm, 7.9% when the length was 15 μm, and 5.7% when the length was 100 μm, thereby confirming a decreasing tendency. Accordingly, it was discovered and confirmed that the electrostatic breakdown occurring at the time of high pressure jet cleaning is able to be effectively suppressed by making the first and second wiring electrodes 7 and 8a be in direct contact with the piezoelectric substrate 2.

In the elastic wave device 1, two resonators are preferably connected in series. However, elastic wave devices according to various preferred embodiments of the present invention may alternatively include a single elastic wave resonator or have a structure in which three or more resonators or a plurality of filters is provided on the piezoelectric substrate. In either case, in the configuration in which the dielectric film is provided under the IDT electrode, the wiring electrode is preferably in direct contact with the piezoelectric substrate at an area outside the region where the dielectric film is provided.

Furthermore, the elastic wave devices according to the present invention is not limited to one that utilizes surface acoustic waves, but may also be one that utilizes boundary acoustic waves.

Furthermore, the elastic wave device 1 preferably has a so-called wafer level package (WLP) structure including the frame-shape support member 11 and the cover member 13. However, elastic wave devices according to the present invention is not limited to the one having such WLP structure. Nevertheless, static electricity is likely to accumulate in the WLP structure because the support member 11 and the cover member 13 that are made of synthetic resin are included. Accordingly, preferred embodiments of the present invention are more effective in the elastic wave device having the WLP structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a dielectric film located on the piezoelectric substrate;
   an interdigital transducer (IDT) electrode that is located on the dielectric film and includes a first comb electrode and a second comb electrode; and
   a first wiring electrode and a second wiring electrode electrically connected to the first comb electrode and the second comb electrode, respectively; wherein
   the first comb electrode and the second comb electrode each include electrode fingers and a busbar, the busbar being in contact with the electrode fingers;
   electrical conductivity of the piezoelectric substrate is higher than electrical conductivity of the dielectric film;
   at least one of the first wiring electrode, the second wiring electrode, the busbar of the first comb electrode, and the busbar of the second comb electrode includes a portion that is in direct contact with the piezoelectric substrate; and
   at least one of the busbar of the first comb electrode and the busbar of the second comb electrode includes a portion that is in direct contact with the piezoelectric substrate.

2. The elastic wave device according to claim 1, wherein at least one of the first wiring electrode and the second wiring electrode protrudes out of a region of the dielectric film and is in contact with the piezoelectric substrate at a protruded location.

3. The elastic wave device according to claim 1, wherein the first wiring electrode and the second wiring electrode each include a portion that is in direct contact with the piezoelectric substrate.

4. The elastic wave device according to claim 1, wherein the piezoelectric substrate is a piezoelectric substrate made of a reduction-treated material.

5. The elastic wave device according to claim 1, further comprising:
   a frame-shape support member provided on the piezoelectric substrate and surrounding a portion where the IDT electrode is provided; and
   a cover member that closes an opening of the support member and defines a wafer level package structure.

6. The elastic wave device according to claim 1, wherein each of the first wiring electrode, the second wiring electrode, the busbar of the first comb electrode, and the busbar of the second comb electrode includes a portion that is in direct contact with the piezoelectric substrate.

7. The elastic wave device according to claim 1, further comprising:
   a frame-shape support member provided on the piezoelectric substrate and surrounding a portion where the IDT electrode is provided; wherein
   the support member includes through holes that penetrate in an up-and-down direction and an under bump metal layer provided in the through holes.

8. The elastic wave device according to claim 1, wherein the first and second wiring electrodes are in direct contact with the piezoelectric substrate at locations where the busbar of the first comb electrode and the busbar of the second comb electrode are each provided with an electrode missing portion.

9. The elastic wave device according to claim 8, wherein no dielectric film is provided at the locations where the electrode missing portions of the busbars of the first and second comb electrodes are provided.

10. The elastic wave device according to claim 1, wherein each of the busbar of the first comb electrode and the busbar of the second comb electrode includes a portion that is in direct contact with the piezoelectric substrate.

11. The elastic wave device according to claim 1, wherein the elastic wave device includes a single resonator, or two or more resonators.

12. The elastic wave device according to claim 1, wherein the elastic wave device uses one of surface acoustic waves and boundary acoustic waves.

13. The elastic wave device according to claim 1, wherein the elastic wave device has a wafer level package structure.

14. A method for manufacturing the elastic wave device according to claim 1, the method comprising:
   a step of forming the dielectric film on the piezoelectric substrate, the dielectric film having a lower electrical conductivity than the piezoelectric substrate;
   a step of forming the first comb electrode and the second comb electrode to form the IDT electrode on the dielectric film;
   a step of forming at least one of the first wiring electrode, the second wiring electrode, the busbar of the first comb electrode, and the busbar of the second comb electrode to include a portion that is in contact with the piezoelectric substrate, the first wiring electrode and the second wiring electrode being electrically connected to the first comb electrode and the second comb electrode.

15. The method according to claim 14, wherein the first wiring electrode and the second wiring electrode are each formed so as to include a portion that is in direct contact with the piezoelectric substrate.

16. The method according to claim 14, wherein a first busbar and a second busbar are formed in such a way that at least one of the busbar of the first comb electrode and the busbar of the second comb electrode includes the portion that is in direct contact with the piezoelectric substrate.

17. The method for fabricating the elastic wave device according to claim 14, wherein the dielectric film located outside the region where the IDT electrode is formed is removed by etching during the step of forming the dielectric film on the piezoelectric substrate.

* * * * *